(12) United States Patent
Yang et al.

(10) Patent No.: US 8,390,752 B2
(45) Date of Patent: Mar. 5, 2013

(54) DISPLAY DEVICE WITH REALIZED A HIGH CONTRAST RATIO AND METHOD FOR FABRICATING THE SAME

(75) Inventors: Joon Young Yang, Bucheon-si (KR); Soo Pool Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 45 days.

(21) Appl. No.: 12/081,709

(22) Filed: Apr. 18, 2008

(65) Prior Publication Data

US 2009/0057667 A1 Mar. 5, 2009

(30) Foreign Application Priority Data

Apr. 19, 2007 (KR) .................... 10-2007-0038113

(51) Int. Cl.
*G02F 1/135* (2006.01)
(52) U.S. Cl. .................. 349/42; 349/43; 349/141
(58) Field of Classification Search .............. 349/42, 349/43, 141
See application file for complete search history.

(56) References Cited

U.S. PATENT DOCUMENTS

| 6,256,081 | B1 * | 7/2001 | Lee et al. ............ 349/141 |
| 6,803,982 | B2 * | 10/2004 | Komatsu ............ 349/141 |
| 6,924,863 | B2 | 8/2005 | Nishida et al. |
| 2001/0013915 | A1 * | 8/2001 | Song ............ 349/141 |
| 2007/0002245 | A1 * | 1/2007 | Lee et al. ............ 349/141 |

FOREIGN PATENT DOCUMENTS

JP 2003-282275 * 10/2003

* cited by examiner

*Primary Examiner* — Howard Weiss
*Assistant Examiner* — Steven Rao
(74) *Attorney, Agent, or Firm* — McKenna, Long & Aldridge, LLP.

(57) ABSTRACT

Provided are a display device and a fabricating method thereof. The display device includes a substrate, a gate line, a common line, common electrodes, an insulating layer, a data line, a drain electrode, and pixel electrodes. The gate line is disposed in a first direction. The common line is disposed substantially parallel to the gate line. The common electrodes branch from the common line. The insulating layer covers the gate line, the common line, and the common electrodes. The channel patterns are disposed on the insulating layer to correspond to the gate electrode. The data line is disposed in a second direction. The drain electrode is electrically connected with the channel pattern. The pixel electrodes are formed of an opaque metal. Thus, the display device may improve contrast ratio.

6 Claims, 10 Drawing Sheets

Fig. 8C

DISPLAY DEVICE WITH REALIZED A HIGH CONTRAST RATIO AND METHOD FOR FABRICATING THE SAME

This application claims the benefit of Korean Patent Application No. 2007-0038113, filed on Apr. 19, 2007, which is hereby incorporated by reference for all purposes as if fully set forth herein.

BACKGROUND OF THE INVENTION

1. Field of the Invention

The present invention relates to a display device and a method for fabricating the same, and more particularly, to a display device that can realize a high contrast ratio, and a method for fabricating the same.

2. Discussion of the Related Art

An information processing apparatus that can process a large amount of data within a short time, and a display device that displays data processed by the information processing apparatus in the form of an image are being rapidly developed.

Examples of the display device for processing data processed by the information processing apparatus include a liquid crystal display (LCD) device, an organic light emitting diode (OLED) displaying information using an organic light emitting material, and a plasma display panel (PDP) displaying information using plasma.

The LCD device includes a thin film transistor (TFT) substrate including thin film transistors (TFTs), a color filter (CF) substrate including color filters, and liquid crystal (LC) material interposed between the TFT and CF substrates.

A data voltage delivered through a data line is applied to a pixel electrode included in the TFT substrate. An electric field is formed by a potential difference between the data voltage and a common voltage applied to a common electrode to align LCs. The arrangement of the LCs changes depending on the size of the potential difference between the common electrode and the pixel electrode, and accordingly, the amount of light passing through a pixel region changes. Through this process, the LCD device can display an image.

Materials that may be used for the pixel electrode include a transparent conductive material. However, since light transmittance of light passing through the pixel electrode is low, contrast ratio is reduced.

SUMMARY OF THE INVENTION

Accordingly, the present invention is directed to a display device and method for fabricating the same that substantially obviates one or more of the problems due to limitations and disadvantages of the related art.

An advantage of the invention is to provide a display device that increases aperture ratio and improves contrast ratio.

Another advantage of the invention is to provide a method for fabricating the display device.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a display device includes: a substrate; a gate line disposed in a first direction on the substrate, and having a gate electrode; a common line on the substrate, the common line being substantially parallel to the gate line; at least a common electrode branching from the common line; an insulating layer covering the gate line, the common line, and the common electrodes; a channel pattern on the insulating layer, the channel pattern corresponding to the gate electrode; a data line disposed in a second direction, and having a source electrode electrically connected with the channel pattern; a drain electrode separated from the source electrode and electrically connected with the channel pattern; and pixel electrode electrically connected with the drain electrode and formed of an opaque metal.

In another aspect, a method for fabricating a display device includes: forming a gate line having a gate electrode, a common line, and a common electrode branching from the common line on a substrate; forming an insulating layer on the gate line, the common line, and the common electrode; forming channel patterns corresponding to the gate electrode on the insulating layer; forming a data line having a source electrode electrically connected to the channel pattern, and a drain electrode electrically connected with the channel pattern and separated from the source electrode on the insulating layer; and forming a pixel electrode electrically connected to the drain electrode and formed of an opaque metal.

In yet another aspect of the present invention, a display device comprises: a substrate; a gate line disposed in a first direction on the substrate, and having a gate electrode; a common line on the substrate, the common line being in parallel to the gate line; an insulating layer covering the gate line, the common line, and a common electrode; a channel pattern on the insulating layer, the channel pattern corresponding to the gate electrode; a data line disposed in a second direction and having a source electrode electrically connected with the channel pattern; a drain electrode separated from the source electrode and electrically connected with the channel pattern; a common electrode electrically connected to the common line and formed of an opaque metal; and a pixel electrode electrically connected to the drain electrode and formed of an opaque metal.

In further another aspect of the present invention, a method for fabricating a display device, the method comprises: forming a gate line having a gate electrode, and a common line on a substrate; forming an insulating layer on the gate line and the common line; forming a channel pattern corresponding to the gate electrode on the insulating layer; forming a data line having a source electrode electrically connected with the channel pattern, and a drain electrode electrically connected with the channel pattern and separated from the source electrode on the insulating layer; forming a passivation layer on the data line and the drain electrode; and forming a common electrode electrically connected to the common line and formed of an opaque metal, and a pixel electrode electrically connected to the drain electrode and formed of an opaque metal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 1:
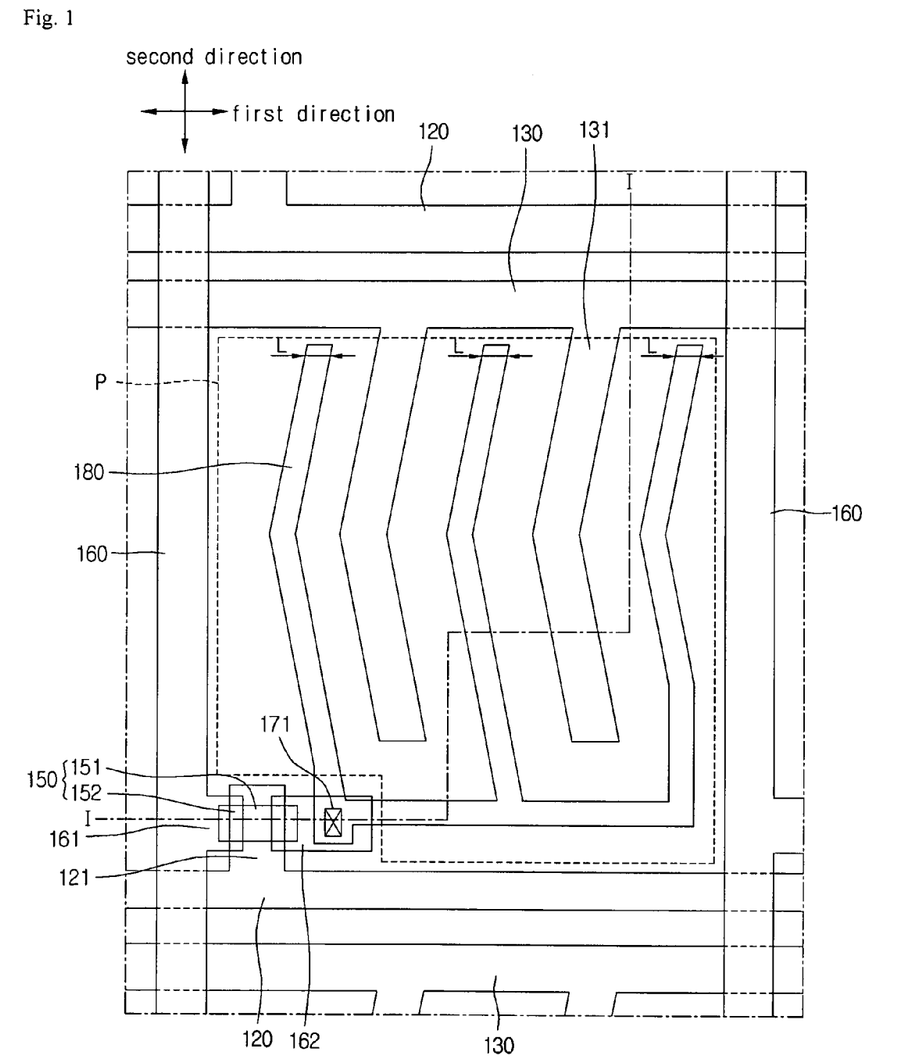
FIG. 1 is a plan view of a display device according to an embodiment of the present invention.
Figure 2:
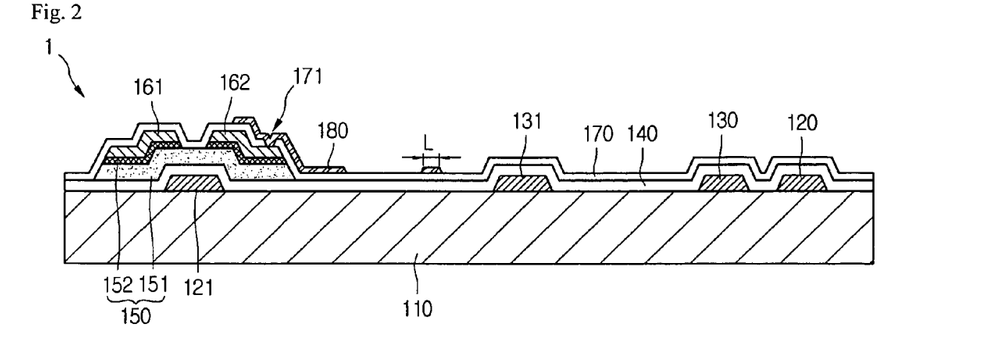
FIG. 2 is a cross-sectional view taken along the line I-I' of FIG. 1.

FIG. 1 is a plan view of a display device according to an embodiment of the present invention, and FIG. 2 is a cross-sectional view taken along the line I-I' of FIG. 1.

Referring to FIGS. 1 and 2, the display device 1 includes a substrate 110, a gate line 120, a common line 130, a common electrode 131, an insulating layer 140, channel patterns 150, a data line 160, a drain electrode 162, a passivation layer 170, and a pixel electrode 180.

The substrate 110 is a transparent insulation substrate. The substrate 110 may be a glass substrate or a quartz substrate, or other suitable material.

The gate line 120 is disposed in a first direction on the substrate 110. Though two gate lines 120 are illustrated in FIG. 1, a plurality of gate lines 120 can be disposed on the substrate 110. Examples of a material that can be used for the gate line 120 include Al, an Al alloy, and Cu or other suitable material. The gate line 120 includes a gate electrode 121 branching from the gate line 120. A plurality of gate electrodes 121 branch from the gate line 120. A gate signal is applied to the gate electrode 121 through the gate line 120.

The common line 130 is disposed substantially in parallel to the gate line 120 on the substrate 110. Though two common lines 130 are illustrated in FIG. 1, a plurality of common lines 130 can be disposed on the substrate 110. Examples of a material that can be used for the common line 130 include Al, an Al alloy, and Cu or other suitable material.

The common electrode 131 branches from the common line 120. A common voltage is applied to the common electrode 131 through the common line 130. A material that may be used for the common electrode 131 may be the same as that of the common line 130.

The insulating layer 140 covers the gate line 120, the gate electrode 121, the common line 130, and the common electrode 131. Examples of a material that may be used for the insulating layer 140 may include $SiN_x$ and $SiO_x$.

The channel patterns 150 include an amorphous silicon pattern 151 and an n+ amorphous silicon pattern 152.

The amorphous silicon pattern 151 is disposed on the insulating layer 140 to correspond to the gate electrode 121. Examples of a material that may be used for the amorphous silicon pattern 151 include amorphous silicon or other suitable material.

The n+ amorphous silicon pattern 152 is disposed in pairs with a constant interval on the amorphous silicon pattern 151 to correspond to the gate electrode 121. Examples of a material that may be used for the n+ amorphous silicon pattern 152 include amorphous silicon doped with high concentration impurities.

The data line 160 crosses the gate line 120 on the insulating layer 140 in a second direction to define a pixel region P. The data line 160 includes a source electrode 161 electrically connected with one of a pair of n+ amorphous silicon patterns 152 separated from each other. Examples of a material that may be used for the data line 160 include Al, an Al alloy, and Cu or other suitable material.

The drain electrode 162 is electrically connected with the other of the pair of n+ amorphous silicon patterns 152 separated from each other. A material that may be used for the drain electrode 162 may be the same as that of the data line 160.

The passivation layer 170 covers the data line 160, the channel patterns 150, and the drain electrode 162. The passivation layer 170 includes a contact hole exposing a portion of the drain electrode 162. Examples of a material that may be used for the passivation layer 170 include $SiO_x$ and $SiN_x$ or other suitable material.

The pixel electrode 180 is disposed on the passivation layer 170. The pixel electrode 180 is electrically connected with the portion of the drain electrode 162 exposed through the contact hole 171. The pixel electrode 180 may be formed of an opaque metal. Examples of a material that may be used for the pixel electrode 180 include Mo, a Mo alloy, Ti, and a Ti alloy or other suitable material.

In the case where a material that is used for the pixel electrode 180 is a transparent conductive metal, the pixel region P is divided into a non-transmission region formed by the common electrode 131, an intermediate transmission region formed by the pixel electrode 180, and a transmission region disposed between the pixel electrode 180 and the common electrode 131.

On the other hand, in the case where a material that is used for the pixel electrode 180 is an opaque metal, the pixel region P is divided into a non-transmission region formed by the pixel electrode 180 and the common electrode 131, and a transmission region disposed between the pixel electrode 180 and the common electrode 131.

Therefore, since the pixel region P is clearly divided into the transmission region and the non-transmission region in the case where the material used for the pixel electrode 180 is the opaque metal, the display device 1 can improve contrast ratio.

Pixel electrodes 180 have a width "L" of about 1-2 μm, have a comb shape when seen from a plane, and are alternately disposed with respect to the common electrodes 131. Further, the pixel electrodes 180 and the common electrodes 131 can be disposed in zigzags when seen from a plane.

The pixel electrode 180 and the common electrode 131 are disposed inside the pixel region P. Since the width "L" of the pixel electrode 180 is about 1-2 μm, the aperture ratio of the display device 1 improves.

Figure 3A:
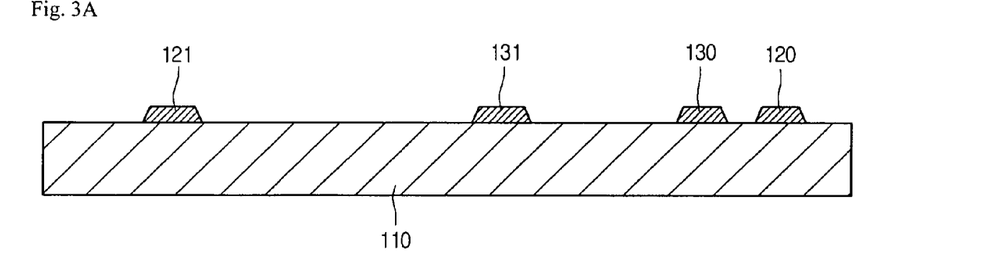
FIGS. 3A through and including 3H are cross-sectional views illustrating a method for fabricating a display device according to another embodiment of the present invention.

FIGS. 3A through and including 3H are cross-sectional views illustrating a method for fabricating a display device according to another embodiment of the present invention.

Referring to FIG. 3A, a substrate 110, which is a transparent insulator, is provided. Examples of materials for the substrate 110 may include a glass substrate and a quartz substrate or other suitable material.

A gate line 120 having a gate electrode 121, a common line 130, and a common electrode 131 branching from the common line 130 are formed on the substrate 110. The common line 130 is parallel to the gate line 120.

To form the gate line 120, the common line 130, and the common electrode 131, a metal layer (not shown) is formed on the entire surface of the substrate 110. Examples of a material that may be used for the metal layer include Al, an Al alloy, and Cu or other suitable material. The metal layer may be formed by chemical vapor deposition (CVD) or a sputtering process, for example.

After the metal layer is formed, a photoresist film (not shown) is formed on the entire surface of the metal layer. The photoresist film is patterned through a photolithography process including an exposure process and a developing process to form photoresist patterns (not shown) having shapes corresponding to the gate line 120, the common line 130, and the common electrode 131 on the metal layer.

The metal layer is patterned using the photoresist patterns as an etch mask to form the gate line 120, the common line 130, and the common electrode 131 on the substrate 110.

Figure 3B:
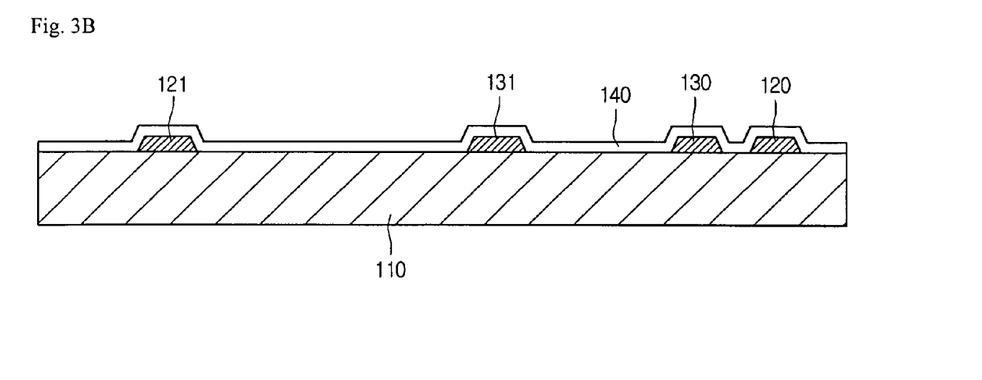

Referring to FIG. 3B, after the gate line 120, the common line 130, and the common electrode 131 are formed on the substrate 110, an insulating layer 140 covering the gate line 120, the common line 130, and the common electrode 131 is formed on the substrate 110. Examples of a material that may be used as the insulating layer 140 include $SiN_x$ and $SiO_x$ or other suitable material.

Figure 3C:
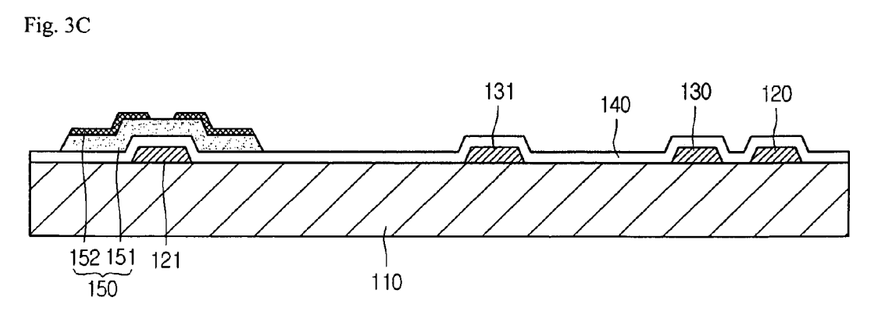

Referring to FIG. 3C, after the insulating layer 140 is formed, channel patterns 150 including an amorphous silicon pattern 151 and an n+ amorphous silicon pattern 152 are formed on the insulating layer 140 to correspond to the gate electrode 121.

To form the channel patterns 150, an amorphous silicon thin film (not shown) and an n+ amorphous silicon thin film (not shown) doped with high concentration impurities are sequentially formed on the insulating layer 140. After that, a photoresist film (not shown) is formed on the n+ amorphous silicon thin film. The photoresist film is patterned through a photolithography process to form photoresist patterns (not shown) on the n+ amorphous silicon thin film.

The amorphous silicon thin film and the n+ amorphous silicon thin film are patterned using the photoresist patterns as an etch mask to form the channel patterns 150 corresponding to the gate electrode 121 on the insulating layer 140. A pair of n+ amorphous silicon patterns 152 is formed with a predetermined interval on the amorphous silicon pattern 151.

Figure 3D:
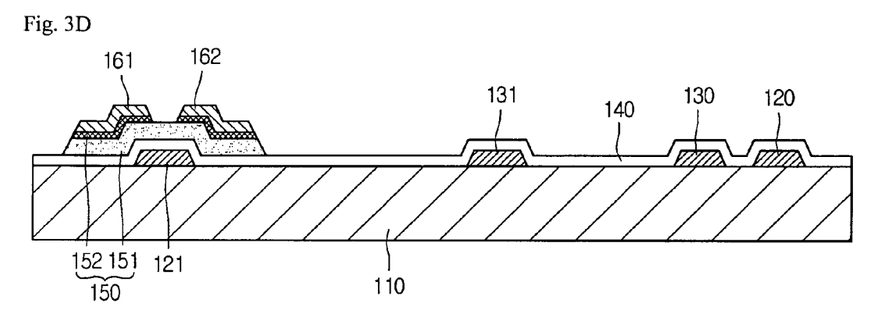

Referring to FIG. 3D, after the channel patterns 150 are formed, a data line 160 having a source electrode 161, and a drain electrode 162 are formed on the insulating layer 140. The data line 160 crosses the gate line 120.

To form the data line 160 and the drain electrode 162, a source/drain metal layer (not shown) is formed on the entire surface of the insulating layer 140. Examples of a material that may be used for the source/drain metal layer include Al, an Al alloy, and Cu or other suitable material. The source/drain metal layer may be formed using CVD or a sputtering process, for example.

After the source/drain metal layer is formed, a photoresist film (not shown) is formed on the entire surface of the source/drain metal layer. The photoresist film is patterned through a photolithography process including an exposure process and a developing process to form photoresist patterns (not shown) on the source/drain metal layer. The photoresist patterns are used for forming the data line and the drain electrode. The source/drain metal layer is patterned using the photoresist patterns as an etch mask to form the data line 160 and the drain electrode 162 on the insulating layer 140.

The source electrode 161 is electrically connected with one of the pair of n+ amorphous silicon patterns 152. The drain electrode 162 is electrically connected with the other of the pair of n+ amorphous silicon patterns 152.

Figure 3E:
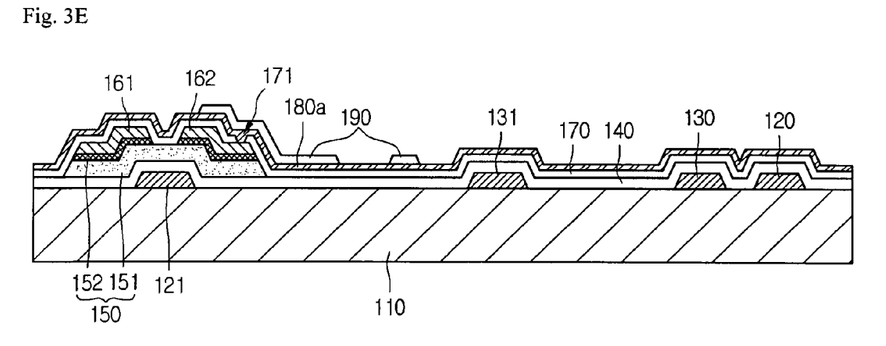

Referring to FIG. 3E, after the data line 160 and the drain electrode 162 are formed, a passivation layer 170 covering the data line 160 and the drain electrode 162 is formed.

To form the passivation layer 170, an inorganic layer (not shown) is formed on the entire surface of the data line 160 and the drain electrode 162. Examples of a material that may be used for the inorganic layer include $SiO_x$ and $SiN_x$ or other suitable material. After the inorganic layer is formed, a photoresist film (not shown) is formed on the entire surface of the inorganic layer. The photoresist film is patterned through a photolithography process including an exposure process and a developing process to form photoresist patterns (not shown) exposing a portion of the inorganic layer corresponding to a portion of the drain electrode 162. The inorganic layer is patterned using the photoresist patterns as an etch mask to form the passivation layer 170 including a contact hole 171 exposing a portion of the drain electrode 162 on the data line 160 and the drain electrode 162.

Figure 3F:
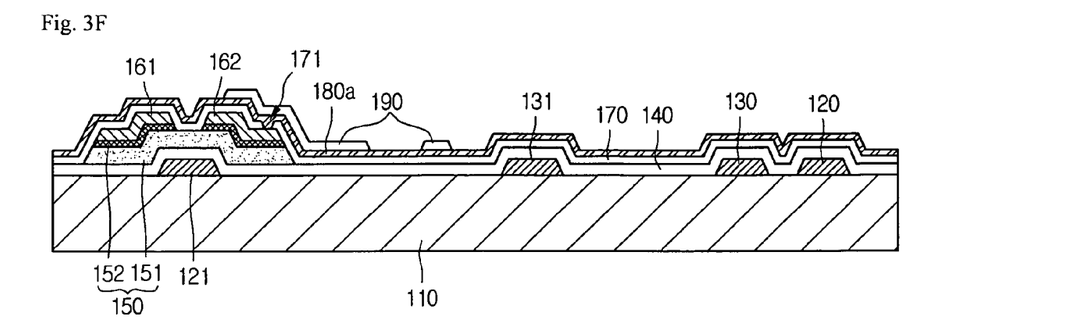

Referring to FIG. 3F, after the passivation layer 170 is formed, a pixel electrode 180 formed of an opaque metal is formed on the passivation layer 170.

To form the pixel electrode 180, a metal layer 180a is formed on the passivation layer 170. Examples of a material that may be used for the metal layer 180a include Mo, a Mo alloy, Ti, and a Ti alloy or other suitable material. The metal layer 180a may be formed using CVD or a sputtering process or other suitable process.

After the metal layer 180a is formed, a photoresist film (not shown) is formed on the entire surface of the metal layer 180a. The photoresist film is patterned through a photolithography process including an exposure process and a developing process to form first photoresist patterns 190 on the metal layer 180a.

Figure 3G:
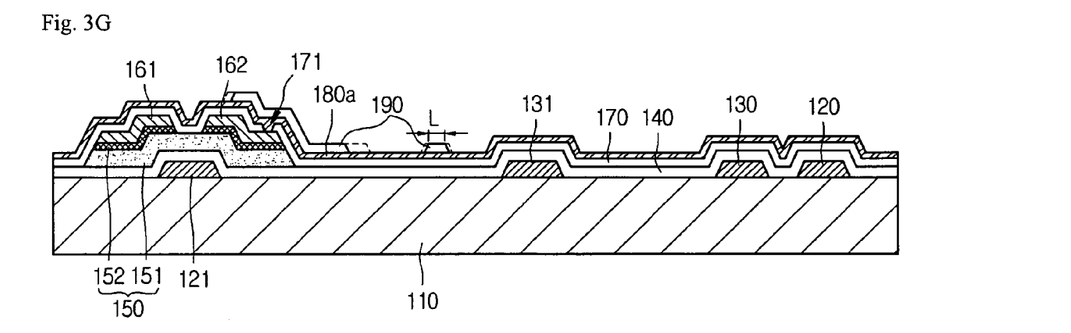

Referring to FIG. 3G, after the first photoresist patterns 190 are formed, the planar areas of the first photoresist patterns 190 reduce through an ashing process, and second photoresist patterns 191 having a shape for forming the pixel electrodes 180 are formed. The second photoresist patterns 191 have a width L of about 1-2 µm.

Figure 3H:
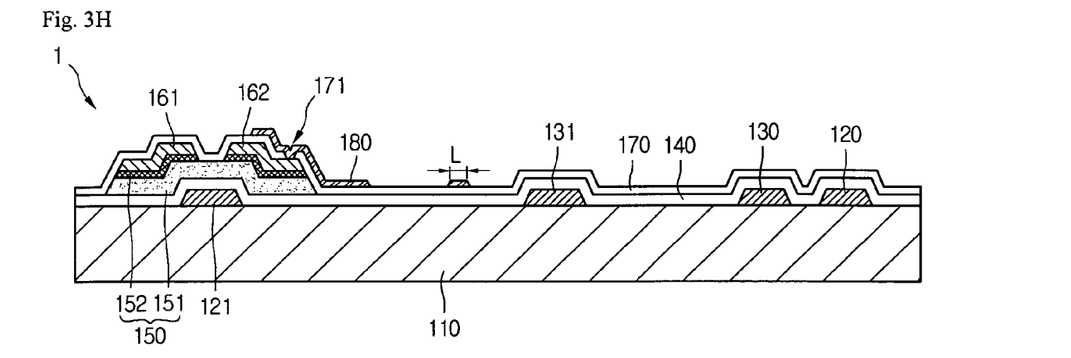

Referring to FIG. 3H, after the second photoresist patterns 191 are formed, the metal layer 180a is patterned using the second photoresist patterns 191 as an etch mask. Since the width L of the second photoresist patterns 191 is about 1-2 µm, the metal layer 180a is patterned using a dry etching process. Through these processes, the pixel electrode 180 is formed on the passivation layer 170. The pixel electrode 180 has a width L of about 1-2 µm.

The pixel electrode 180 may be formed through the following process.

To form the pixel electrode 180, an opaque metal layer (not shown) is formed on the passivation layer 170, and a photoresist film (not shown) is formed on the entire surface of the metal layer. The photoresist film is patterned through a photolithography process including an exposure process and a developing process to form photoresist patterns (not shown)

on the metal layer. The photoresist patterns are used for forming the pixel electrode. The metal layer is patterned using the photoresist patterns as an etch mask to form the pixel electrode 180 on the passivation layer 170. The pixel electrode 180 has a width L of about 1-2 μm. Through these processes, the display device 1 is formed.

Figure 4A:
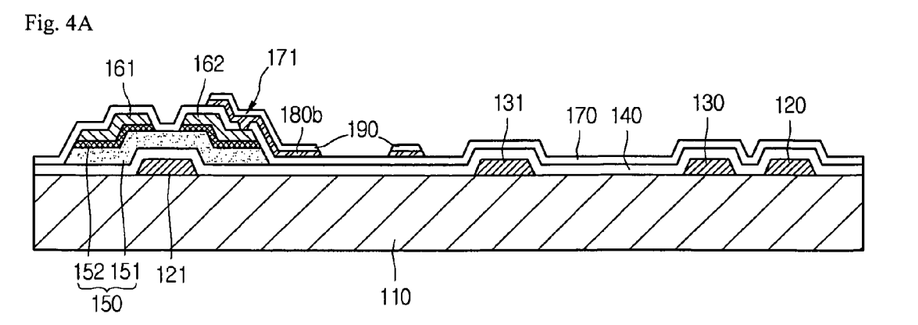
FIGS. 4A through and including 4C are cross-sectional views illustrating a method for fabricating a display device according to yet another embodiment of the present invention.

FIGS. 4A through and including 4C are cross-sectional views illustrating a method for fabricating a display device according to yet another embodiment of the present invention. The method according to yet another embodiment is the same as the method as illustrated in FIGS. 3A through and including 3H except the process of forming the pixel electrode. Therefore, the same names and reference numerals are used for the same elements.

Referring to FIG. 4A, a gate line 120 having a gate electrode 121, a common line 130, a common electrode 131 branching from the common line 130, an insulating layer 140, channel patterns 150, a data line 160 having a source electrode 161, a drain electrode 162, and a passivation layer 170 are formed on a substrate 110. Then, a pixel electrode 180 formed of an opaque metal is formed on the passivation layer 170.

To form the pixel electrode 180, an opaque metal layer (not shown) is formed on the passivation layer 170. Examples of a material that may be used for the metal layer include Mo, a Mo alloy, Ti, and a Ti alloy or other suitable material. The metal layer may be formed using CVD or a sputtering process, for example.

After the metal layer is formed, a photoresist film (not shown) is formed on the entire surface of the metal layer. The photoresist film is patterned using a photolithography process including an exposure process and a developing process to form first photoresist patterns 190 on the metal layer. The metal layer is patterned using the first photoresist patterns as an etch mask to form a preliminary pixel electrode 180b on the passivation layer 170. The metal layer may be etched through a wet etching process, for example.

Figure 4B:
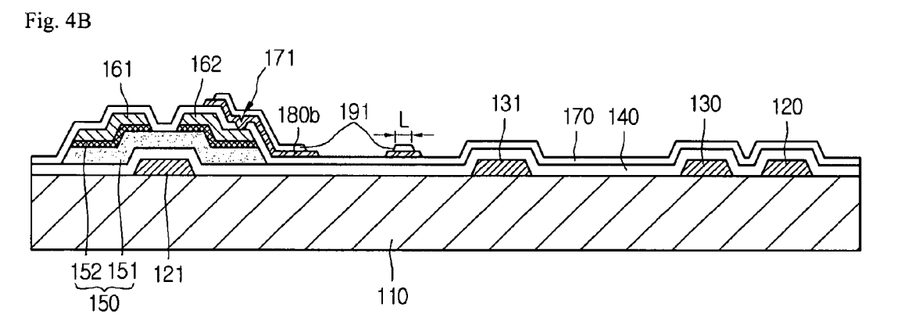

Referring to FIG. 4B, after the preliminary pixel electrode 180b is formed, the planar areas of the first photoresist patterns 190 reduce through an ashing process, and second photoresist patterns 191 are formed on the preliminary pixel electrode 180b.

Figure 4C:
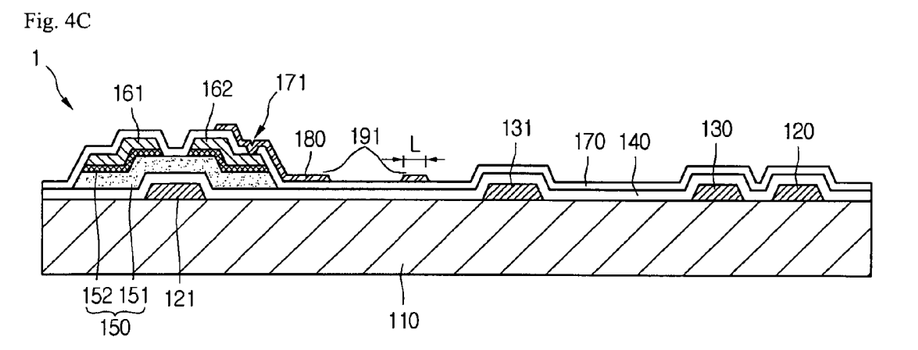

Referring to FIG. 4C, after the second photoresist patterns 191 are formed, the preliminary pixel electrode 180b is patterned using the second photoresist patterns 191 as an etch mask. Since the width "L" of the second photoresist patterns 191 is about 1-2 μm, the preliminary pixel electrode 180b is etched using a dry etching process. Through these processes, the pixel electrode 180 is formed on the passivation layer 170. The pixel electrode 180 has a width "L" of about 1-2 μm.

As described above, most of the metal layer is etched using the wet etching process and an extremely small portion of the metal layer is etched using the dry etching process, so that the dry etching process time may be shortened and thus the entire process time may be shortened.

Figure 5:
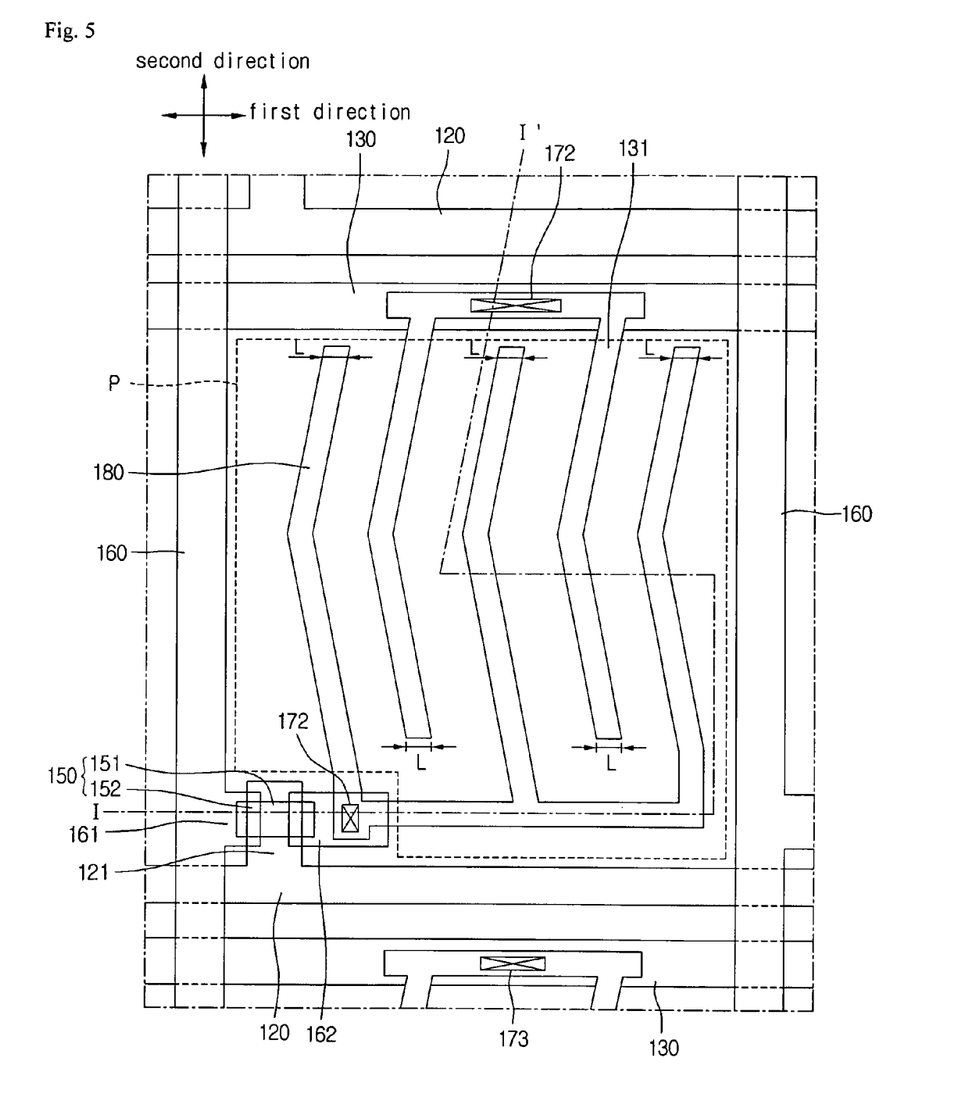
FIG. 5 is a plan view of a display device according to yet another embodiment of the present invention.
Figure 6:
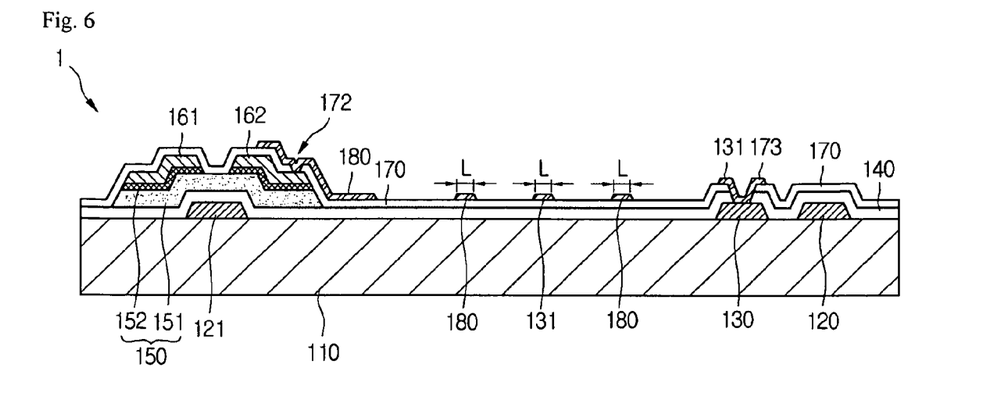
FIG. 6 is a cross-sectional view taken along the line I-I' of FIG. 5.

FIG. 5 is a plan view of a display device according to yet another embodiment, and FIG. 6 is a cross-sectional view taken along the line I-I' of FIG. 5.

Referring to FIGS. 5 and 6, the display device 1 includes a substrate 110, a gate line 120, a common line 130, an insulating layer 140, channel patterns 150, a data line 160, a drain electrode 162, a passivation layer 170, a common electrode 131, and a pixel electrode 180.

The substrate 110 is a transparent insulation substrate. The substrate 110 may be a glass substrate or a quartz substrate, for example.

The gate line 120 is disposed in a first direction on the substrate 110. Though two gate lines 120 are illustrated in FIG. 5, a plurality of gate lines 120 can be disposed on the substrate 110. Examples of a material that may be used for the gate line 120 include Al, an Al alloy, and Cu or other suitable material. The gate line 120 includes a gate electrode 121 branching from the gate line 120. A plurality of gate electrodes 121 branch from the gate line 120. A gate signal is applied to the gate electrode 121 through the gate line 120.

The common line 130 is disposed in parallel to the gate line 120 on the substrate 110. Though two common lines 130 are illustrated in FIG. 5, a plurality of common lines 130 can be disposed on the substrate 110. Examples of a material that may be used for the common line 130 include Al, an Al alloy, and Cu or other suitable material.

The insulating layer 140 covers the gate line 120, the gate electrode 121, the common line 130, and the common electrode 131. Examples of a material that may be used for the insulating layer include $SiN_x$ and $SiO_x$ or other suitable material.

The channel patterns 150 include an amorphous silicon pattern 151 and an n+ amorphous silicon pattern 152.

The amorphous silicon pattern 151 is disposed on the insulating layer 140 to correspond to the gate electrode 121. Examples of a material that may be used for the amorphous silicon pattern 151 include amorphous silicon or other suitable material.

The n+ amorphous silicon pattern 152 is disposed in pairs with a constant interval on the amorphous silicon pattern 151 to correspond to the gate electrode 121. Examples of a material that may be used for the n+ amorphous silicon pattern 152 include amorphous silicon doped with high concentration impurities.

The data line 160 crosses the gate line 120 on the insulating layer 140 in a second direction to define a pixel region P. The data line 160 includes a source electrode 161 electrically connected with one of a pair of n+ amorphous silicon patterns 152 separated from each other. Examples of a material that may be used for the data line 160 include Al, an Al alloy, and Cu or other suitable material.

The drain electrode 162 is electrically connected with the other of the pair of n+ amorphous silicon patterns 152 separated from each other. A material used for the drain electrode 162 may be the same as that of the data line 160.

The passivation layer 170 covers the data line 160, the channel patterns 150, and the drain electrode 162. The passivation layer 170 includes a first contact hole 172 exposing a portion of the drain electrode 162, and a second contact hole 173 exposing a portion of the common line 130. Examples of a material that may be used for the passivation layer 170 include $SiO_x$ and $SiN_x$ or other suitable material.

The common electrode 131 is disposed on the passivation layer 170 and electrically connected with the common line 130. The common electrode 131 is formed of an opaque metal. Examples of a material that may be used for the common electrode 131 include Mo, a Mo alloy, Ti, and a Ti alloy or other suitable material.

The pixel electrode 180 is disposed on the passivation layer 170 and electrically connected with the portion of the drain electrode 162 exposed through the first contact hole 172. The material that can be used for the pixel electrode 180 may be the same as that of the common electrode 131.

In the case where a material used for the common electrode 131 and the pixel electrode 180 is a transparent conductive metal, the pixel region P is divided into an intermediate transmission region formed by the pixel electrode 180 and the common electrode 131, and a transmission region disposed between the pixel region 180 and the common electrode 131.

On the other hand, in the case where a material used for the common electrode 131 and the pixel electrode 180 is an opaque metal, the pixel region P is divided into a non-transmission region formed by the pixel electrode 180 and the common electrode 131, and a transmission region disposed between the pixel electrode 180 and the common electrode 131.

Therefore, since the pixel region P is clearly divided into the transmission region and the non-transmission region in the case where the material used for the common electrode 131 and the pixel electrode 180 is the opaque metal, the display device 1 may improve contrast ratio.

Pixel electrodes 180 have a width "L" of about 1-2 µm, have a comb shape when seen from a plane, and are alternately disposed with respect to the common electrodes 131. Further, the pixel electrodes 180 and common electrodes 131 can be disposed in zigzags when seen from a plane.

The pixel electrode 180 and the common electrode 131 are disposed inside the pixel region P. Since the width "L" of the common electrode 131 and the pixel electrode 180 is about 1-2 µm, the display device 1 can realize high aperture ratio and high brightness.

Figure 7A:
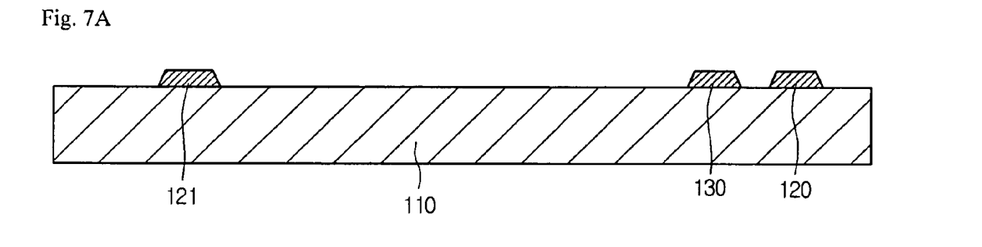
FIGS. 7A through and including 7H are cross-sectional views illustrating a method for fabricating a display device according to yet another embodiment of the present invention.

FIGS. 7A through and including 7H are cross-sectional views illustrating a method for fabricating a display device according to yet another embodiment of the present invention.

Referring to FIG. 7A, a substrate 110, which is a transparent insulator, is provided. Examples of the substrate 110 include a glass substrate and a quartz substrate or other suitable material.

A gate line 120 having a gate electrode 121, and a common line 130 are formed on the substrate 110. The common line 130 is in parallel to the gate line 120.

To form the gate line 120 and the common line 130, a metal layer (not shown) is formed on the entire surface of the substrate 110. Examples of a material that may be used for the metal layer include Al, an Al alloy, and Cu or other suitable material. The metal layer may be formed using CVD or a sputtering process or other suitable process.

After the metal layer is formed, a photoresist film (not shown) is formed on the entire surface of the metal layer. The photoresist film is patterned using a photolithography process including an exposure process and a developing process to form photoresist patterns (not shown) corresponding to the gate line 120 and the common line 130 on the metal layer.

The metal layer is patterned using the photoresist patterns as an etch mask to form the gate line 120 and the common line 130 on the substrate 110.

Figure 7B:
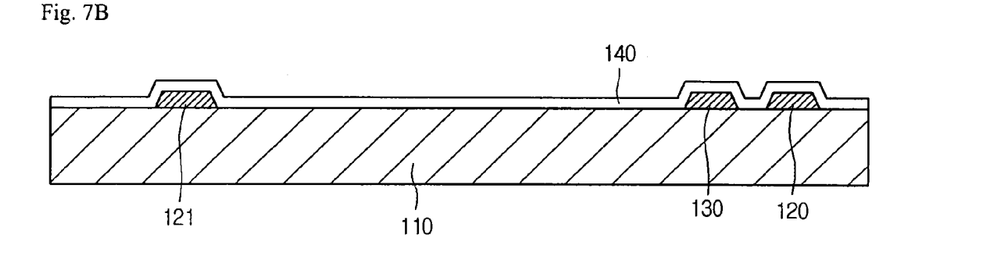

Referring to FIG. 7B, after the gate line 120 and the common line 130 are formed on the substrate 110, an insulating layer 140 covering the gate line 120, the common line 130, and a common electrode 131 is formed on the substrate 110. Examples of a material that may be used for the insulating layer 140 include $SiN_x$ and $SiO_x$ or other suitable material.

Figure 7C:
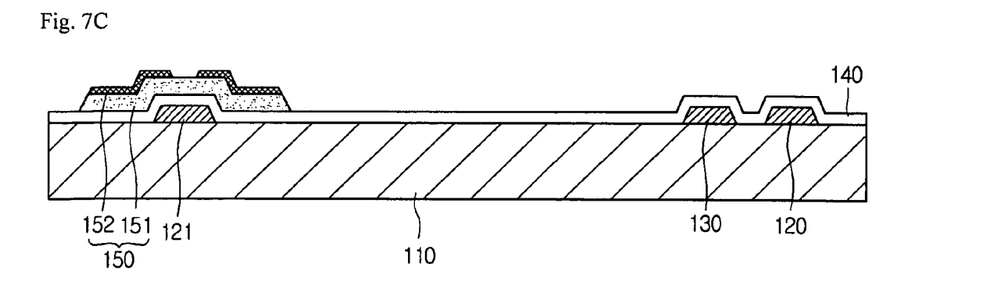

Referring to FIG. 7C, after the insulating layer 140 is formed, channel patterns 150 including an amorphous silicon pattern 151 and an n+ amorphous silicon pattern 152 are formed on the insulating layer 140.

To form the channel patterns 150, an amorphous silicon thin film (not shown) and an n+ amorphous silicon thin film (not shown) doped with high concentration impurities are sequentially deposited on the insulating layer 140. After that, a photoresist film (not shown) is formed on the n+ amorphous silicon thin film. The photoresist film is patterned through a photolithography process to form photoresist patterns (not shown) on the n+ amorphous silicon thin film.

The amorphous silicon thin film and the n+ amorphous silicon thin film are patterned using the photoresist patterns as an etch mask to form the channel patterns 150 on the insulating layer 140. At this point, a pair of n+ amorphous silicon patterns 152 is formed with a predetermined interval on the amorphous silicon pattern 151.

Figure 7D:
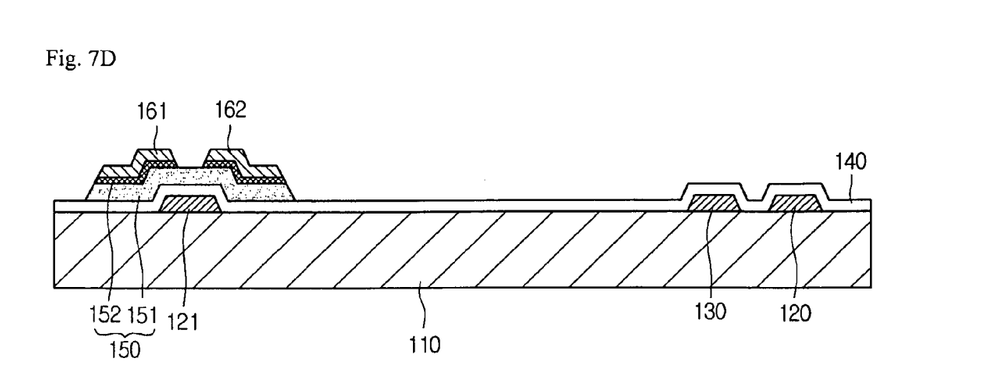

Referring to FIG. 7D, after the channel patterns 150 are formed, a data line 160 having a source electrode 161, and a drain electrode 162 are formed on the insulating layer 140. The data line 160 crosses the gate line 120.

To form the data line 160 and the drain electrode 162, a source/drain metal layer (not shown) is formed on the entire surface of the insulating layer 140. Examples of a material that may be used for the source/drain metal layer include Al, an Al alloy, and Cu or other suitable material. The source/drain metal layer may be formed using CVD or a sputtering process or other suitable process.

After the source/drain metal layer is formed, a photoresist film (not shown) is formed on the entire surface of the source/drain metal layer. The photoresist film is patterned through a photolithography process including an exposure process and a developing process to form photoresist patterns (not shown) corresponding to the data line and the drain electrode on the source/drain metal layer. The source/drain metal layer is patterned using the photoresist patterns as an etch mask to form the data line 160 and the drain electrode 162 on the insulating layer 140.

The source electrode 161 is electrically connected with one of the pair of n+ amorphous silicon patterns 152. The drain electrode 162 is electrically connected with the other of the pair of n+ amorphous silicon patterns 152.

Figure 7E:
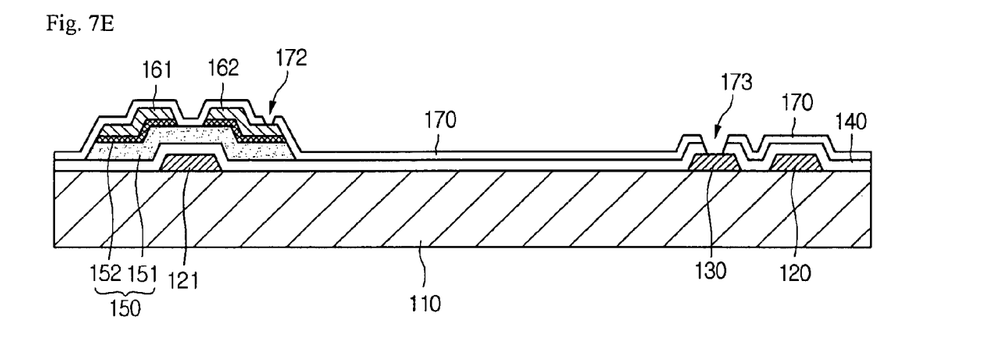

Referring to FIG. 7E, after the data line 160 and the drain electrode 162 are formed, a passivation layer 170 covering the data line 160 and the drain electrode 162 is formed. To form the passivation layer 170, an inorganic layer (not shown) is formed on the entire surface of the data line 160 and the drain electrode 162. Examples of a material that may be used for the inorganic layer include $SiO_x$ and $SiN_x$ or other suitable material. After the inorganic layer is formed, a photoresist film (not shown) is formed on the entire surface of the inorganic layer. The photoresist film is patterned through a photolithography process including an exposure process and a developing process to form photoresist patterns (not shown) exposing regions of the inorganic layer corresponding to portions of the common line 130 and the drain electrode 162. The inorganic layer is patterned using the photoresist patterns as an etch mask to form the passivation layer 170 on the data line 160 and the drain electrode 162. The passivation layer 170 includes a first contact hole 172 exposing the portion of the drain electrode 162, and a second contact hole 173 exposing the portion of the common line 130.

After the passivation layer 170 is formed, the common electrode 131 and a pixel electrode 180 are formed on the passivation layer 170.

Figure 7F:
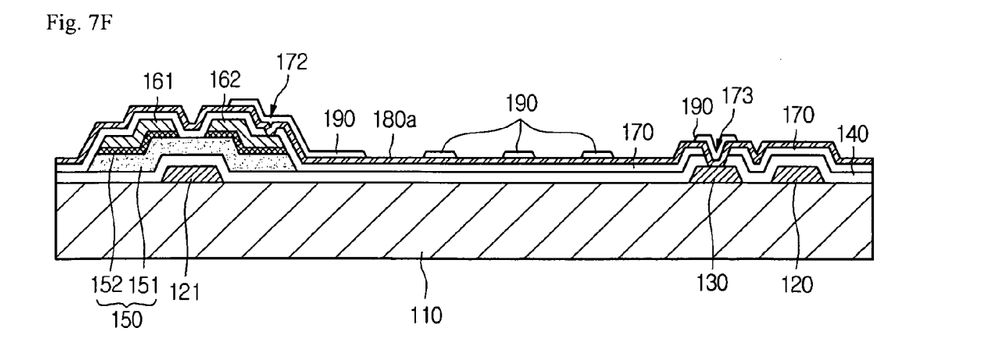

Referring to FIG. 7F, to form the common electrode 131 and the pixel electrode 180, an opaque metal layer 180a is formed on the passivation layer 170. Examples of a material that may be used for the metal layer 180a include Mo, a Mo alloy, Ti, and a Ti alloy or other suitable material. The metal layer 180a may be formed using CVD or a sputtering process or other suitable process.

After the metal layer 180a is formed, a photoresist film (not shown) is formed on the entire surface of the metal layer 180a. The photoresist film is patterned through a photolithography process including an exposure process and a developing process to form first photoresist patterns 190 on the metal layer 180a.

Figure 7G:
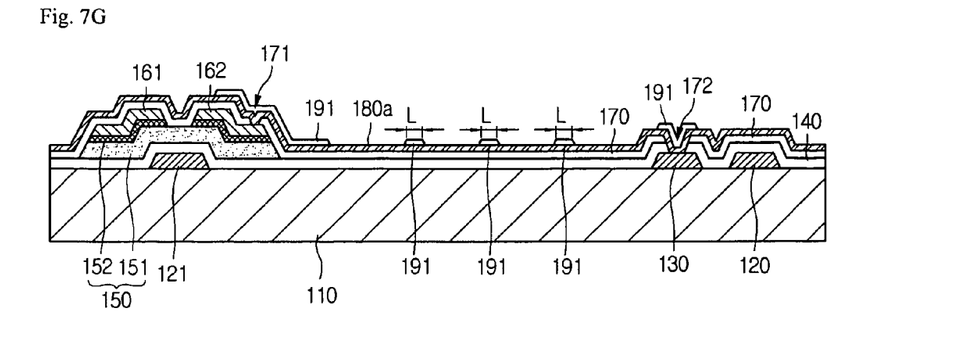

Referring to FIG. 7G, after the first photoresist patterns 190 are formed, the planar areas of the first photoresist patterns 190 reduce through an ashing process, and second photoresist patterns 191 having shapes corresponding to the common electrode 131 and the pixel electrodes 180 are formed. The second photoresist patterns 191 have a width "L" of about 1-2 µm.

Figure 7H:
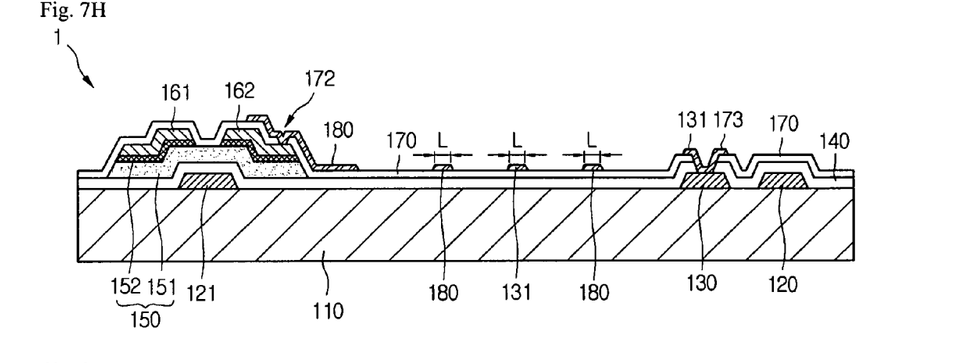

Referring to FIG. 7H, after the second photoresist patterns 191 are formed, the metal layer 180a is patterned using the second photoresist patterns 191 as an etch mask. Since the width "L" of the second photoresist patterns 191 is about 1-2 µm, the metal layer 180a is patterned using a dry etching process. Through these processes, the common electrode 131 and the pixel electrode 180 are formed on the passivation layer 170. The common electrode 131 and the pixel electrode 180 have a width "L" of about 1-2 µm.

The common electrode 131 and the pixel electrode 180 can be formed through the following process.

To form the common electrode 131 and the pixel electrode 180, a metal layer (not shown) is formed on the passivation layer 170, and a photoresist film (not shown) is formed on the entire surface of the metal layer. The photoresist film is patterned through a photolithography process including an exposure process and a developing process to form photoresist patterns (not shown) on the metal layer. The photoresist patterns are used for forming the common electrode 131 and pixel electrode 180. The photoresist patterns have a width of about 1-2 µm. The metal layer is patterned using the photoresist patterns as an etch mask to form the common electrode 131 and the pixel electrode 180 on the passivation layer 170. The common electrode 131 and pixel electrode 180 have a width "L" of about 1-2 µm. Through these processes, the display device 1 is formed.

Figure 8A:
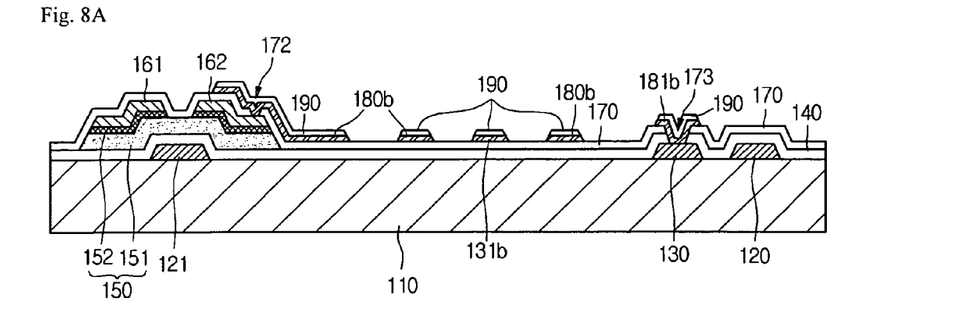
FIGS. 8A through and including 8C are cross-sectional views illustrating a method for fabricating a display device according to yet another embodiment of the present invention.

FIGS. 8A through and including 8C are cross-sectional views illustrating a method for fabricating a display device according to yet another embodiment of the present disclosure. The method according to yet another embodiment is the same as the method of FIGS. 7A through 7H except the formation of the common electrode and the pixel electrode. Therefore, the same names and reference numerals are used for same elements.

Referring to FIG. 8A, a gate line 120 having a gate electrode 121, a common line 130, a insulating layer 140, channel patterns 150, a data line 160 having a source electrode 161, a drain electrode 162, and a passivation layer 170 are formed on a substrate 110. Then, a common electrode 131 and a pixel electrode 180 are formed on the passivation layer 170. The common electrode 131 and the pixel electrode 180 are formed of an opaque metal.

To form the common electrode 131 and the pixel electrode 180, an opaque metal layer (not shown) is formed on the passivation layer 170. Examples of a material that may be used for the metal layer include Mo, a Mo alloy, Ti, and a Ti alloy or other suitable material. The metal layer may be formed using CVD or a sputtering process or other suitable process.

After the metal layer is formed, a photoresist film (not shown) is formed on the entire surface of the metal layer. The photoresist film is patterned using a photolithography process including an exposure process and a developing process to form first photoresist patterns 190 on the metal layer. The metal layer is patterned using the first photoresist patterns as an etch mask to form a preliminary common electrode 131b and a preliminary pixel electrode 180b on the passivation layer 170. The metal layer is etched through a wet etching process.

Figure 8B:
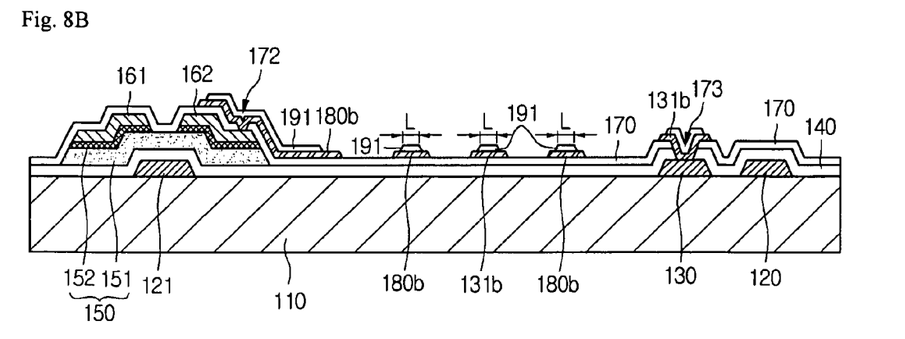

Referring to FIG. 8B, after the preliminary common electrode 131b and the preliminary pixel electrode 180b are formed, the planar areas of the first photoresist patterns 190 reduce through an ashing process, and second photoresist patterns 191 are formed on the preliminary common electrode 131b and the preliminary pixel electrode 180b. The second photoresist patterns 191 have a width "L" of about 1-2 µm.

Figure 8C:
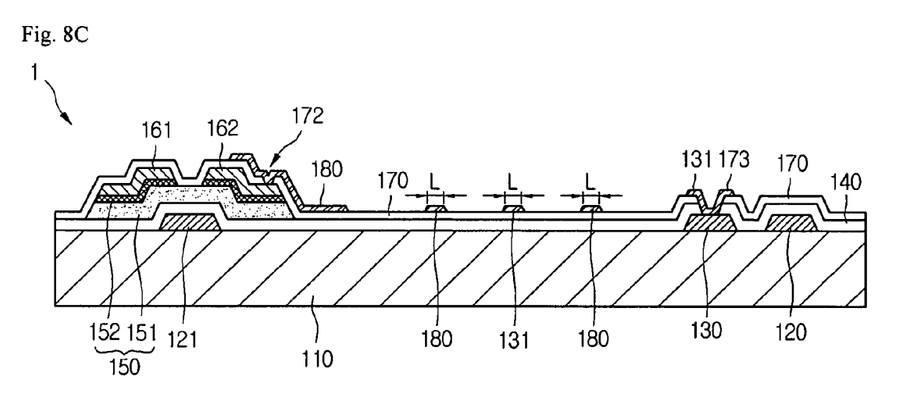

Referring to FIG. 8C, after the second photoresist patterns 191 are formed, the preliminary common electrode 131b and the preliminary pixel electrode 180b are patterned using the second photoresist patterns 191 as an etch mask. Since the width "L" of the second photoresist patterns 191 is about 1-2 µm, the preliminary common electrode 131b and the preliminary pixel electrode 180b are etched using a dry etching process. Through these processes, the common electrode 131 and the pixel electrode 180 are formed on the passivation layer 170. The common electrode 131 and the pixel electrode 180 have a width "L" of about 1-2 µm. As described above, most of the metal layer is etched using the wet etching process and a residual portion of the metal layer is etched using the dry etching process, so that the dry etching process is shortened and thus the entire process time is shortened.

As described above in detail, the present invention includes the pixel electrode formed of the opaque metal to provide a display device of high contrast ratio.

Also, the present invention includes a method for fabricating a display device including a pixel electrode formed of an opaque metal. Therefore, a display device of having a high contrast ratio can be manufactured.

Any reference in this specification to "one embodiment," "an embodiment," "example embodiment," etc., indicates that a particular feature, structure, or characteristic described in connection with the embodiment is included in at least one embodiment of the invention. The appearances of such phrases throughout the specification are not necessarily all referring to the same embodiment. Further, when a particular feature, structure, or characteristic is described in connection with any embodiment, it is noted that it is within the purview of one skilled in the art to effect such feature, structure, or characteristic in connection with other embodiments.

It will be apparent to those skilled in the art that various modifications and variations can be made without departing from the spirit or scope of the invention. Thus, it is intended that the present invention cover the modifications and variations of this invention provided they come within the scope of the appended claims and their equivalents.

What is claimed is:

1. A display device having a liquid crystal comprising:
a substrate;
a gate line disposed in a first direction on the substrate, and having a gate electrode;
a common line on the substrate, the common line being substantially parallel to the gate line;
at least a common electrode branching from the common line, wherein the common electrode and the common line are formed as a single body;
an insulating layer covering the gate line, the common line, and the common electrodes;
a channel pattern on the insulating layer, the channel pattern corresponding to the gate electrode;
a data line disposed in a second direction and having a source electrode electrically connected with the channel pattern;

a drain electrode separated from the source electrode and electrically connected with the channel pattern; and a pixel electrode electrically connected with the drain electrode and formed of an opaque metal to improve a contrast ratio, wherein the pixel electrode is formed on a passivation layer, wherein the passivation layer is formed on the data line, the channel pattern and the drain electrode, wherein the pixel electrode has a width of about 1-2 μm to improve an aperture ratio, wherein the common line is disposed across a pixel region from the gate line, wherein the common electrode and the pixel electrode are arranged in a zigzag pattern along the vertical direction of the gate line, wherein an arrangement of the liquid crystal is determined by a potential difference between the common electrode and the pixel electrode.

2. The display device according to claim 1, wherein the pixel electrode is formed of at least one of a Mo, a Mo alloy, a Ti, and a Ti alloy.

3. The display device according to claim 1, wherein the common electrode and the pixel electrode are arranged in an alternating pattern.

4. A display device having a liquid crystal comprising:
a substrate;
a gate line disposed in a first direction on the substrate, and having a gate electrode;
a common line on the substrate, the common line being substantially parallel to the gate line;
an insulating layer covering the gate line, the common line, and a common electrode;
a channel pattern on the insulating layer, the channel pattern corresponding to the gate electrode;
a data line disposed in a second direction and having a source electrode electrically connected with the channel pattern;
a drain electrode separated from the source electrode and electrically connected with the channel pattern;
a common electrode electrically connected to the common line by a contact hole and formed of an opaque metal to improve a contrast ratio; and
a pixel electrode electrically connected to the drain electrode and formed of an opaque metal to improve a contrast ratio,
wherein the pixel electrode is formed on a passivation layer,
wherein the passivation layer is formed on the data line, the channel pattern and the drain electrode,
wherein the pixel electrode has a width of about 1-2 μm to improve an aperture ratio,
wherein the common electrode has a width of about 1-2 μm to improve an aperture ratio,
wherein the common line is disposed across a pixel region from the gate line,
wherein the common electrode and the pixel electrode are arranged in a zigzag pattern along the vertical direction of the gate line,
wherein an arrangement of the liquid crystal is determined by a potential difference between the common electrode and the pixel electrode.

5. The display device according to claim 4, wherein each of the common electrode and the pixel electrode comprise at least one of a Mo, a Mo alloy, a Ti, and a Ti alloy.

6. The display device according to claim 4, wherein the common electrode and the pixel electrode are arranged in an alternating pattern.

* * * * *